United States Patent
Ueno (10) Patent No.: US 6,713,868 B2
(45) Date of Patent: Mar. 30, 2004

(54) SEMICONDUCTOR DEVICE HAVING LEADLESS PACKAGE STRUCTURE

(75) Inventor: Yutaka Ueno, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 13 days.

(21) Appl. No.: 10/080,580

(22) Filed: Feb. 25, 2002

(65) Prior Publication Data

US 2003/0102542 A1 Jun. 5, 2003

(30) Foreign Application Priority Data

Nov. 30, 2001 (JP) .................................. 2001-367482

(51) Int. Cl.[7] ...................... H01L 23/04; H01L 31/0203
(52) U.S. Cl. ...................... 257/730; 257/433; 257/670; 257/787; 257/621
(58) Field of Search ................................ 257/678, 711, 257/730, 99, 100, 695, 696, 787, 433, 668, 700, 618, 619, 620, 621, 622, 782, 783, 784, 788, 789, 795, 684, 731; 438/65, 113, 127, 667

(56) References Cited

U.S. PATENT DOCUMENTS

| 5,741,729 A | * | 4/1998 | Selna .......................... 438/125 |
| 5,752,182 A | * | 5/1998 | Nakatsuka et al. ......... 455/333 |
| 6,301,122 B1 | | 10/2001 | Ishikawa et al. |
| 6,383,835 B1 | * | 5/2002 | Hata et al. |
| 6,399,415 B1 | * | 6/2002 | Bayan et al. ............... 438/106 |

* cited by examiner

*Primary Examiner*—Long Pham
*Assistant Examiner*—DiLinh Nguyen
(74) *Attorney, Agent, or Firm*—Oblon, Spivak, McClelland, Maier, Neustadt, P.C.

(57) ABSTRACT

A semiconductor device according to one embodiment includes a substrate, a semiconductor chip arranged on the substrate, a first electrode formed in the substrate and connected to the semiconductor chip, a concave portion provided on a side of the substrate, the concave portion being formed to a depth not to reach a top of the substrate from a back of the substrate, and at least part of the first electrode being exposed to the concave portion, and a metal layer formed on the at least part of the first electrode.

15 Claims, 8 Drawing Sheets

SEMICONDUCTOR DEVICE HAVING LEADLESS PACKAGE STRUCTURE

CROSS-REFERENCE TO RELATED APPLICATIONS

This application is based upon and claims the benefit of priority from the prior Japanese Patent Application No. 2001-367482, filed Nov. 30, 2001, the entire contents of which are incorporated herein by reference.

BACKGROUND OF THE INVENTION

1. Field of the Invention

The present invention relates to a resin-sealed semiconductor device having a leadless package structure.

2. Description of the Related Art

Leadless packaging of semiconductor devices has recently been advanced in order to meet the requirements for miniaturizing a portable terminal. A ceramic substrate employs an end-face through hole structure in which a through hole is formed in the end face of the substrate. The employment of the end-face through hole structure is common as a matter of solderability.

In order to manufacture semiconductor devices at low cost, plastic packaging for sealing a chip with resin is under consideration. Especially a resin printing method using liquid resin is predominant over a prior art transfer molding method. This is because an expensive mold is unnecessary and thus a reduction in cost can be accomplished.

Figure 12:
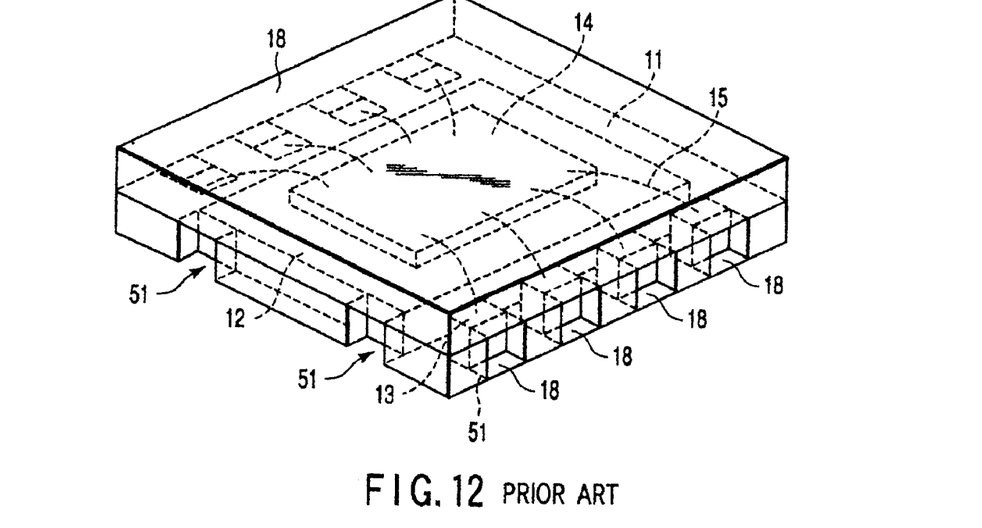
FIG. 12 is a perspective view showing a prior art semiconductor device having an end-face through hole structure.

However, if a substrate having an end-face through hole structure is sealed by the resin printing method, the following problem will occur. As shown in FIG. 12, resin 18 enters a through hole 51 from its opening portion and blocks an end-face electrode 13.

Figure 13:
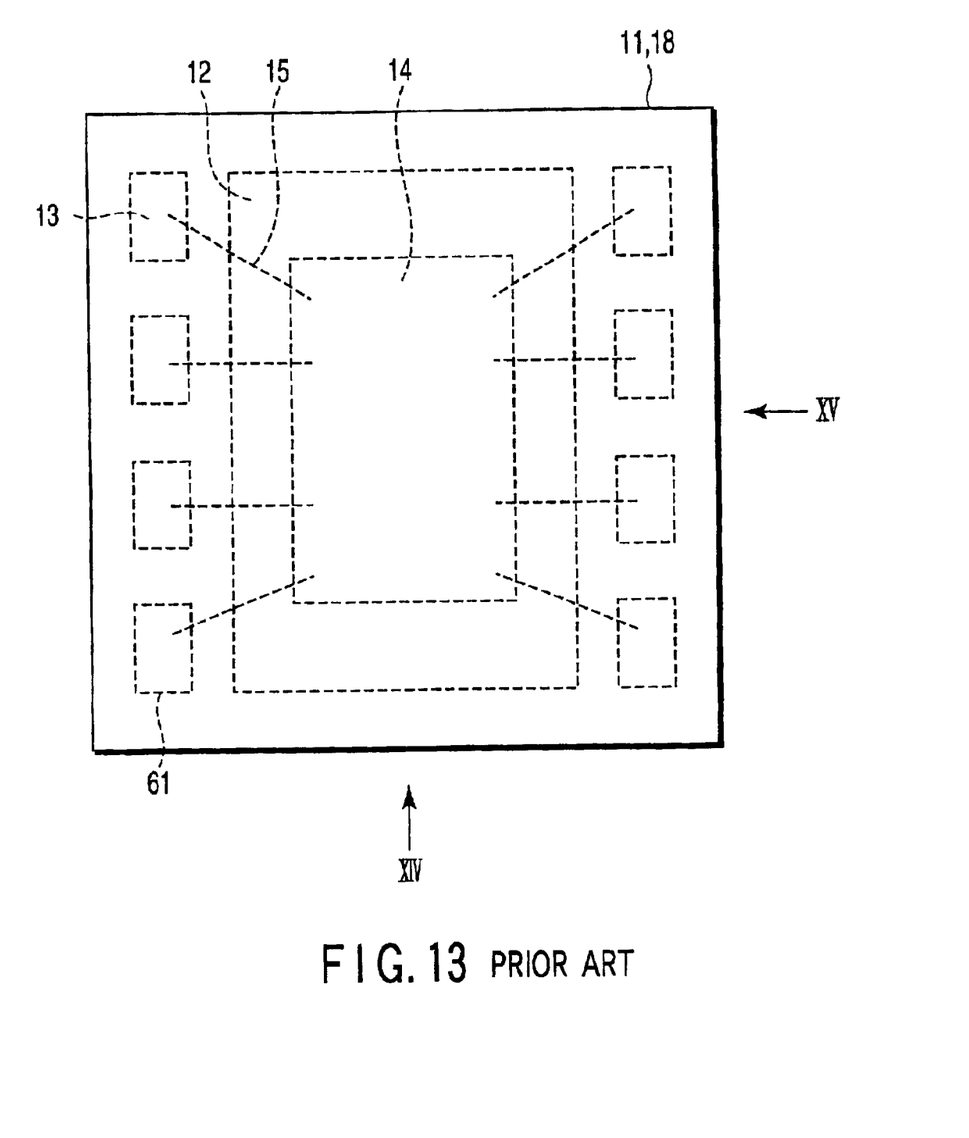
FIG. 13 is a plan view showing a prior art semiconductor device of an LGA system.
Figure 14:
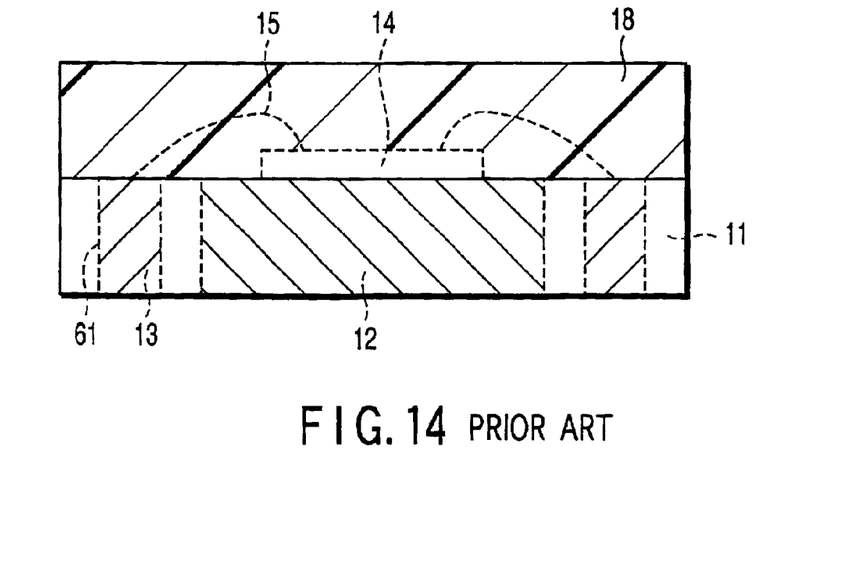
FIG. 14 is a side view of the semiconductor device viewed in the direction of arrow XIV in FIG. 12.
Figure 15:
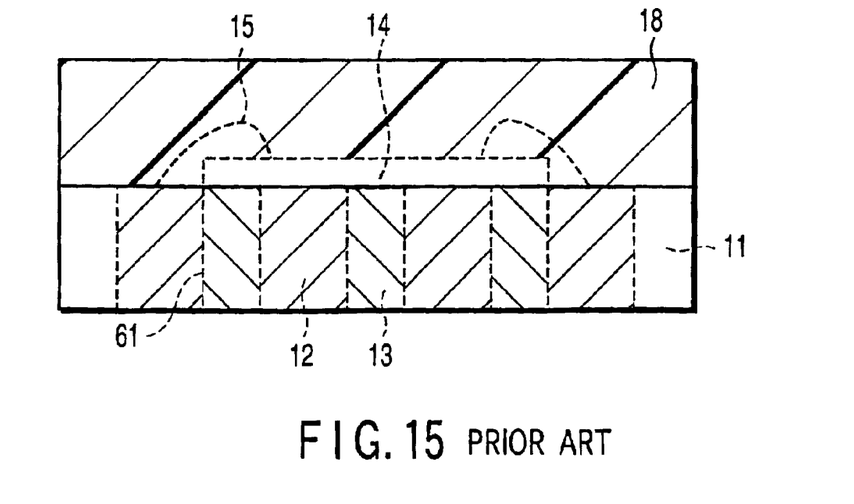
FIG. 15 is a side view of the semiconductor device viewed in the direction of arrow XV in FIG. 12.

If an LGA (Land Grid Array) system not using an end-face through hole but using a normal via hole 61 is adopted as illustrated in FIGS. 13 to 15, it is the most suitable for a resin sealing process because the above problem does not occur. In the LGA system, however, an operator cannot visually check a degree of rising of solder after a motherboard is soldered. Such a solderability problem occurs.

BRIEF SUMMARY OF THE INVENTION

A semiconductor device according to an aspect of the present invention comprises: a substrate; a semiconductor chip arranged on the substrate; a first electrode formed in the substrate and connected to the semiconductor chip; a concave portion provided on a side of the substrate, the concave portion extending from a back of the substrate and terminating in the substrate, and at least part of the first electrode being exposed to the concave portion; and a metal layer formed on the at least part of the first electrode.

DETAILED DESCRIPTION OF THE INVENTION

Embodiments of the present invention will now be described with reference to the accompanying drawings. The components common to the present invention are indicated by the same reference numerals throughout the drawings.

First Embodiment

In the first embodiment, concave portions are formed on the sides of a substrate to such a depth as not to reach the top of the substrate from the back thereof. An operator can check solderability from the concave portions.

Figure 1A:
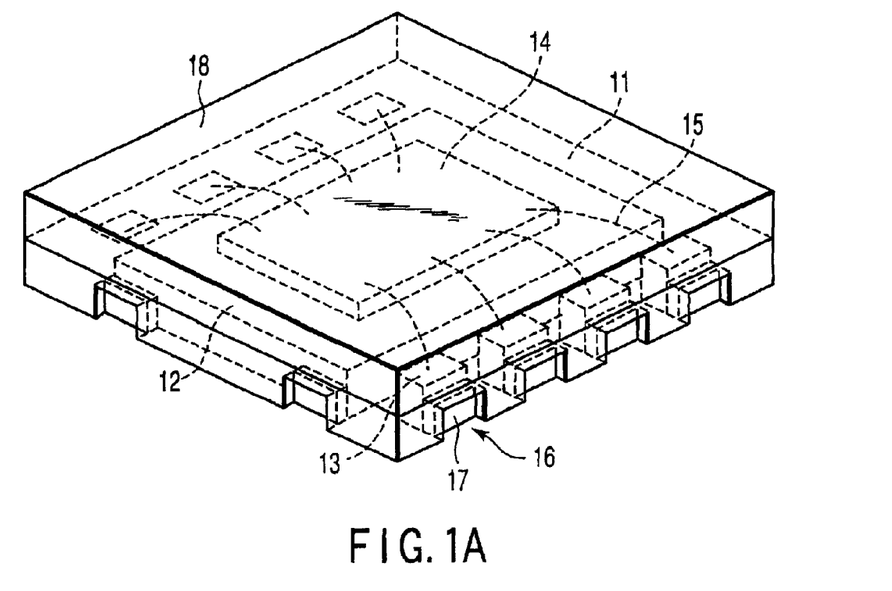
FIG. 1A is a perspective view showing a semiconductor device after being sealed with resin according to a first embodiment of the present invention.
Figure 1B:
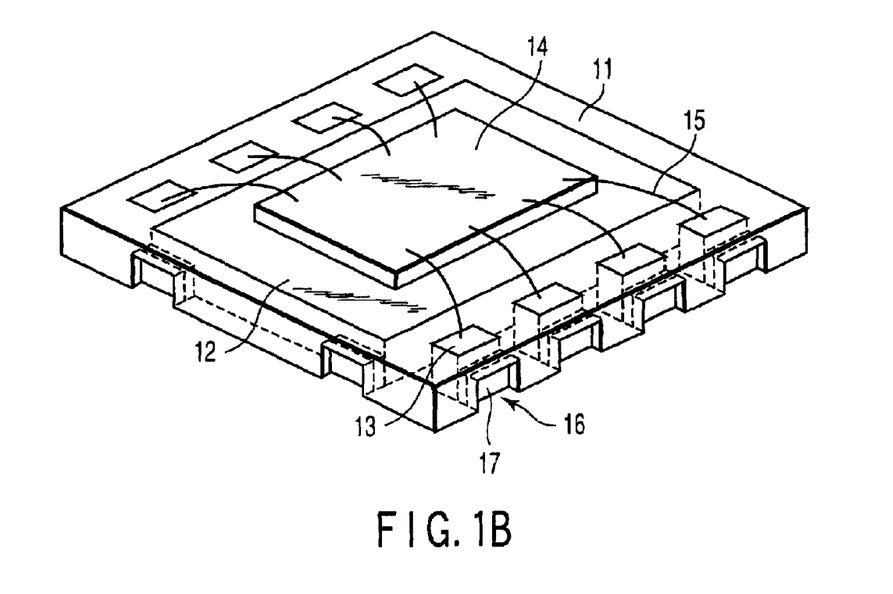
FIG. 1B is a perspective view showing a semiconductor device before being sealed with resin according to the first embodiment of the present invention.
Figure 2:
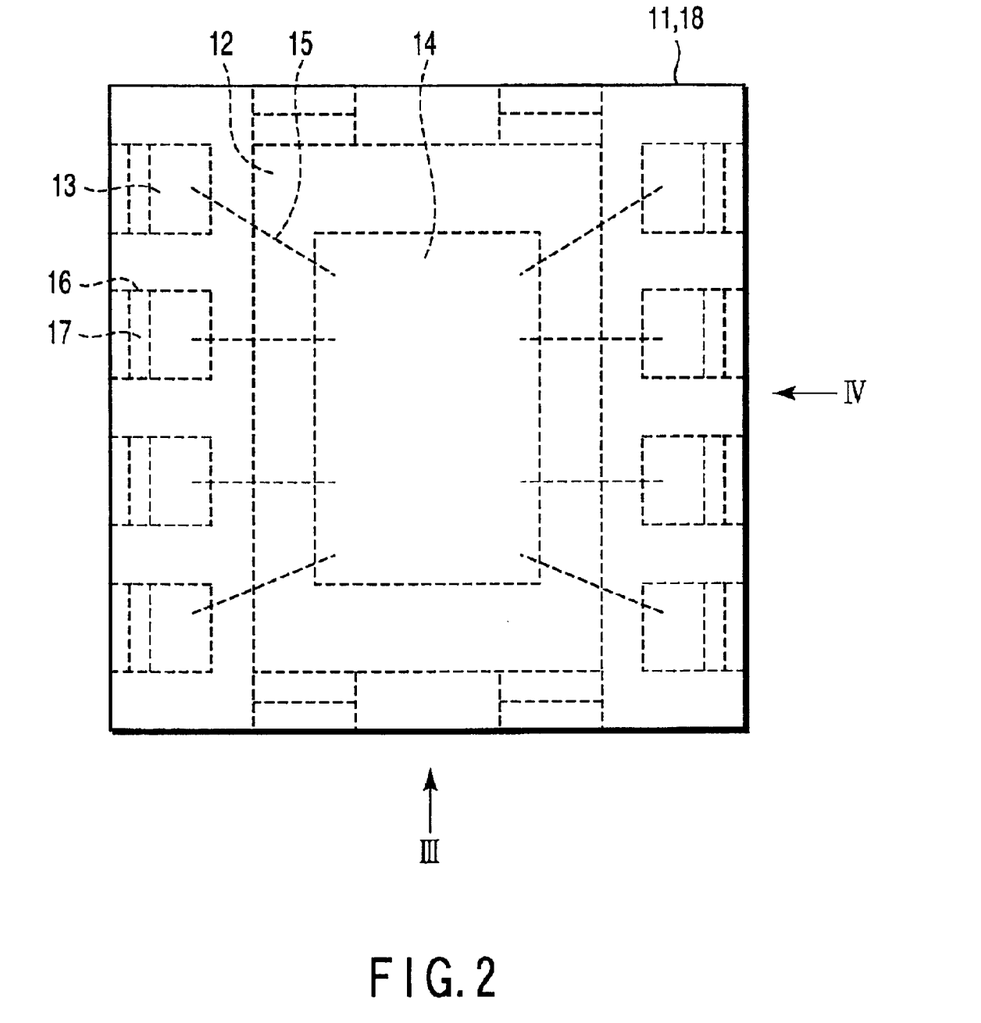
FIG. 2 is a plan view of the semiconductor device according to the first embodiment of the present invention.
Figure 3:
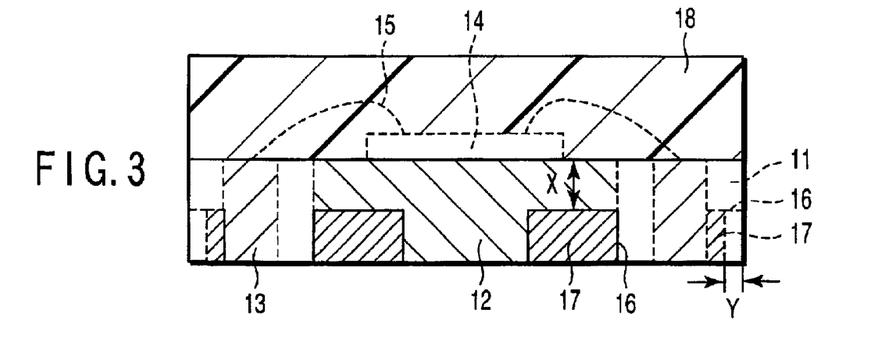
FIG. 3 is a side view of the semiconductor device viewed in the direction of arrow III in FIG. 2.
Figure 4:
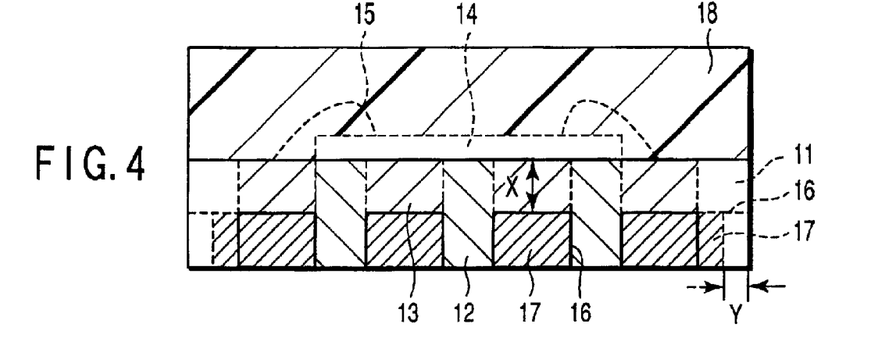
FIG. 4 is a side view of the semiconductor device viewed in the direction of arrow IV in FIG. 2.
Figure 5:
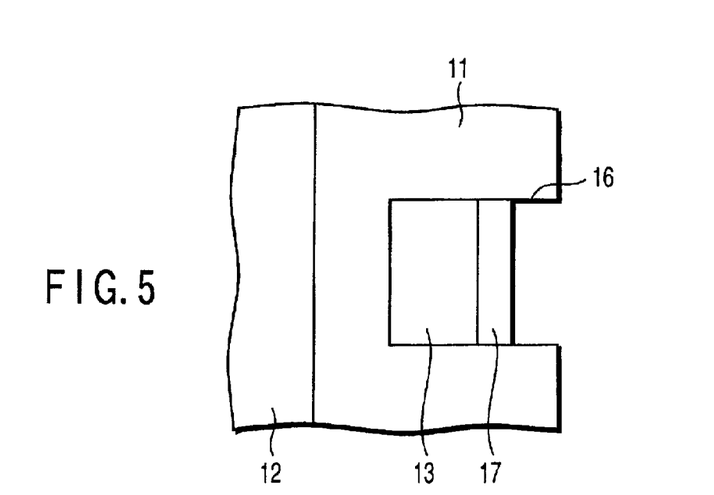
FIG. 5 is a view partly showing the back of the semiconductor device according to the first embodiment of the present invention.

FIG. 1A is a perspective view showing a semiconductor device after being sealed with resin according to the first embodiment of the present invention. FIG. 1B is a perspective view showing a semiconductor device before being sealed with resin according to the first embodiment of the present invention. FIG. 2 is a plan view of the semiconductor device according to the first embodiment of the present invention. FIG. 3 is a side view of the semiconductor device viewed in the direction of arrow III in FIG. 2. FIG. 4 is a side view of the semiconductor device viewed in the direction of arrow IV in FIG. 2. FIG. 5 is a view partly showing the back of the semiconductor device according to the first embodiment of the present invention. The structure of the semiconductor device according to the first embodiment will be described below.

Referring to FIGS. 1 to 5, a first back electrode 12 is provided in a sheet substrate 11, and a plurality of second back electrodes 13 are arranged around the first back electrode 12 in the sheet substrate 11. A semiconductor chip 14 including an active element is mounted on the first back electrode 12 and connected to each of the second back electrodes 13 through a bonding wire 15. The semiconductor chip 14 is sealed with sealing resin 18.

Concave portions 16 are formed on the sides of the sheet substrate 11 and hollowed out of the back of the substrate 11. The concave portions 16 are each, for example, quadrilateral and their depths do not reach the top of the sheet substrate 11 from the back thereof. At least part of each of the second back electrodes 13 is exposed to its corresponding concave portion 16.

Side metalize 17 is formed on the side of each second back electrode 13 that is exposed to the concave portion 16. The side metalize 17 does not reach the side of the sheet substrate 11.

The foregoing semiconductor device according to the first embodiment is manufactured by the following method. First, a sheet substrate 11 is formed. A layout of a plurality of sheet substrates 11, e.g., 25 (5×5) sheet substrates 11 is designed in consideration of mass production. Then, concave portions 16 are hollowed out of the back of the sheet substrate 16 and formed on the sides of the sheet substrates. In order to avoid a leakage of resin that causes a problem when a resin printing method is adopted, the depth of each concave portion 16 is so determined that the concave portion does not reach the top of the sheet substrate 11. After that, a side metalize 17 is formed in each concave portion 16 in contact with it corresponding second back electrode 13. To prevent trouble from occurring in a dicing step after resin sealing, the side metalize 17 is formed to such a size that it can be fitted into the concave portion 16 and prevented from being exposed to the side of a package after dicing. The sheet substrate 11 so obtained is mounted with a semiconductor chip 14. Then, the semiconductor chip 14 is sealed with resin 18 by the resin printing method. Finally, the sheet substrate 11 is separated into substrate pieces by the dicing method, thereby completing semiconductor devices.

According to the first embodiment, the concave portions 16 are formed to such a depth as not to reach the top of the sheet substrate 11 from the back thereof. The resin 18 can thus be prevented from entering the concave portions 16 even though the resin printing method is adopted. Consequently, the semiconductor device of the present invention can be mass-produced.

Since an operator can view the side metalize 17 from the side of the sheet substrate 11, he or she can visually check solderability.

Second Embodiment

The second embodiment of the present invention is directed to a multilayer substrate including a plurality of substrates of the first embodiment.

Figure 6:
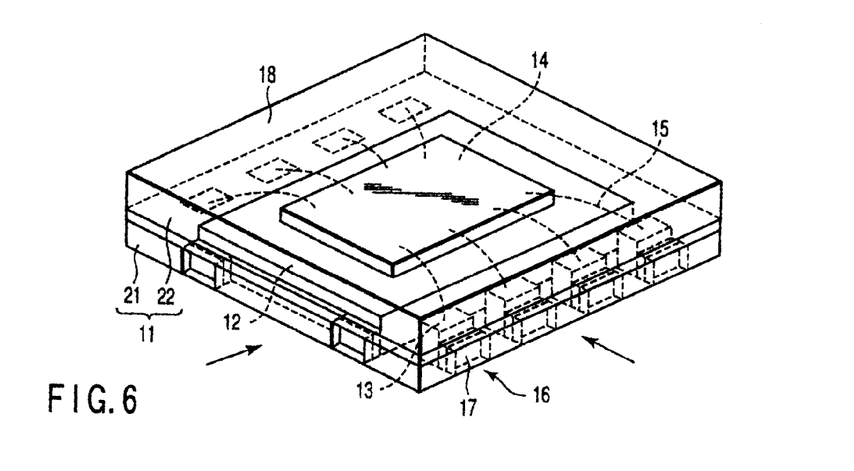
FIG. 6 is a perspective view showing a semiconductor device according to a second embodiment of the present invention.
Figure 7:
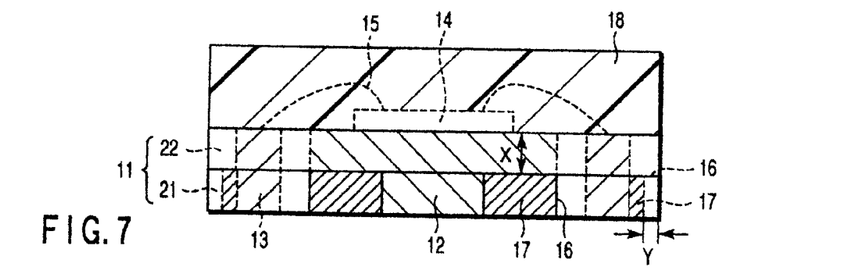
FIG. 7 is a side view of the semiconductor device viewed in the direction of arrow VII in FIG. 6.
Figure 8:
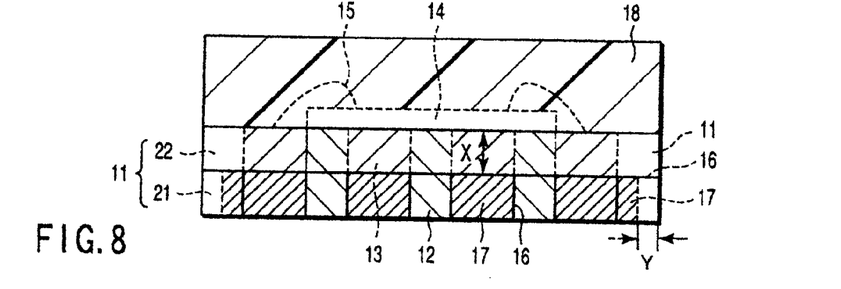
FIG. 8 is a side view of the semiconductor device viewed in the direction of arrow VIII in FIG. 6.

FIG. 6 is a perspective view of a semiconductor device according to the second embodiment of the present invention. FIG. 7 is a side view of the semiconductor device viewed in the direction of arrow VII in FIG. 6. FIG. 8 is a side view of the semiconductor device viewed in the direction of arrow VIII in FIG. 6. The structure of the semiconductor device according to the second embodiment will be described below. The structure different from that of the first embodiment will be mainly described.

As FIGS. 6 to 8 illustrate, the semiconductor device according to the second embodiment comprises a multilayer sheet substrate 11. The sheet substrate 11 includes two layers of a lower substrate 21 and an upper substrate 22. Concave portions 16 are formed on the sides of the lower substrate 21 so as to penetrate the lower substrate 21 from its top to bottom. As in the first embodiment, at least part of each of second back electrodes 13 is exposed to its corresponding concave portion 16. A side metalize 17 is formed on the side of each of the second back electrodes 13 exposed to the concave portions 16. The side metalize 17 is provided so as not to reach the side of the sheet substrate 11 as in the first embodiment.

The multilayer sheet substrate 11 can be composed of three or more layers. Such a multilayer substrate can be obtained if no concave portions 16 are formed on the uppermost substrate mounted with a semiconductor chip 14 or several substrates including the uppermost substrate or they are formed only on the lowermost substrate or several substrates including the lowermost substrate.

The foregoing second embodiment can produce the same advantage as that of the first embodiment.

In the second embodiment, the concave portions 16 are not formed in the upper substrate 22 but formed in the lower substrate 21 so as to penetrate the substrate, and these upper and lower substrates 22 and 21 are combined with each other into the sheet substrate 11. Unlike in the first embodiment, the concave portions 16 need not be formed to such a depth that they do not reach the top of the sheet substrate 11 from the back thereof. In the second embodiment, therefore, the concave portions 16 can be formed more easily than in the first embodiment.

Third Embodiment

The third embodiment of the present invention is directed to a structure in which a semiconductor chip according to the first embodiment is mounted with a passive element as well as an active element.

Figure 9:
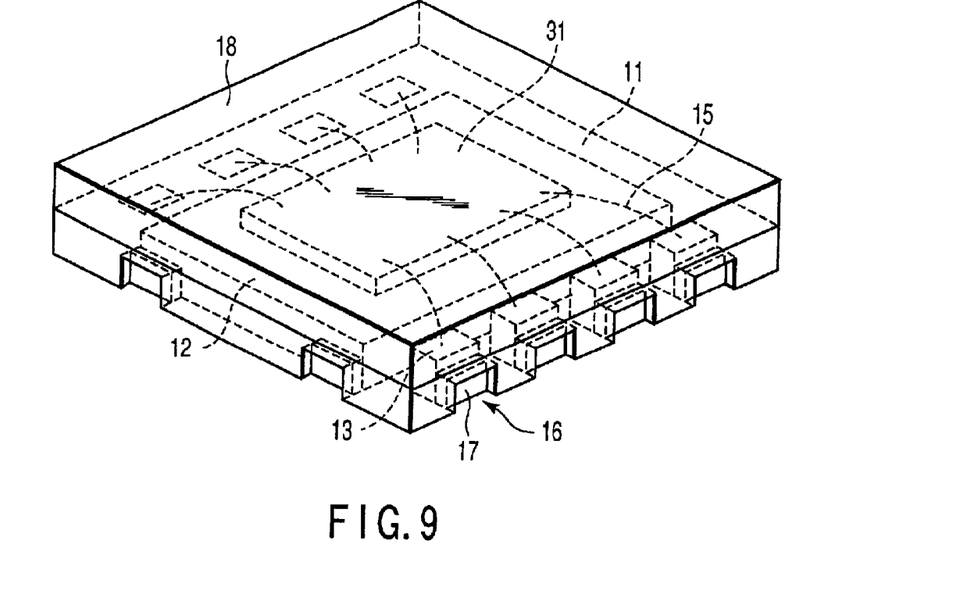
FIG. 9 is a perspective view showing a semiconductor device according to a third embodiment of the present invention.

FIG. 9 is a perspective view of a semiconductor device according to a third embodiment of the present invention. The structure of the semiconductor device according to the third embodiment will be described below. The descriptions of the same components as those of the first embodiment are omitted from the third embodiment.

As is illustrated in FIG. 9, the semiconductor device according to the third embodiment includes an active element and a passive element such as RLC. A power amplifier of a built-in matching circuit type can be formed by an impedance conversion circuit including L and C. The passive element can be formed of a surface-mounting type component or previously built in the substrate 11.

The foregoing third embodiment can provide a built-in matching circuit type power amplifier that is improved in mass-production and solderability.

The structure of the third embodiment can be applied to the multilayer substrate of the second embodiment.

Fourth Embodiment

The fourth embodiment of the present invention is directed to a structure in which magnetic substances are included in the sealing resin according to the first embodiment.

Figure 10:
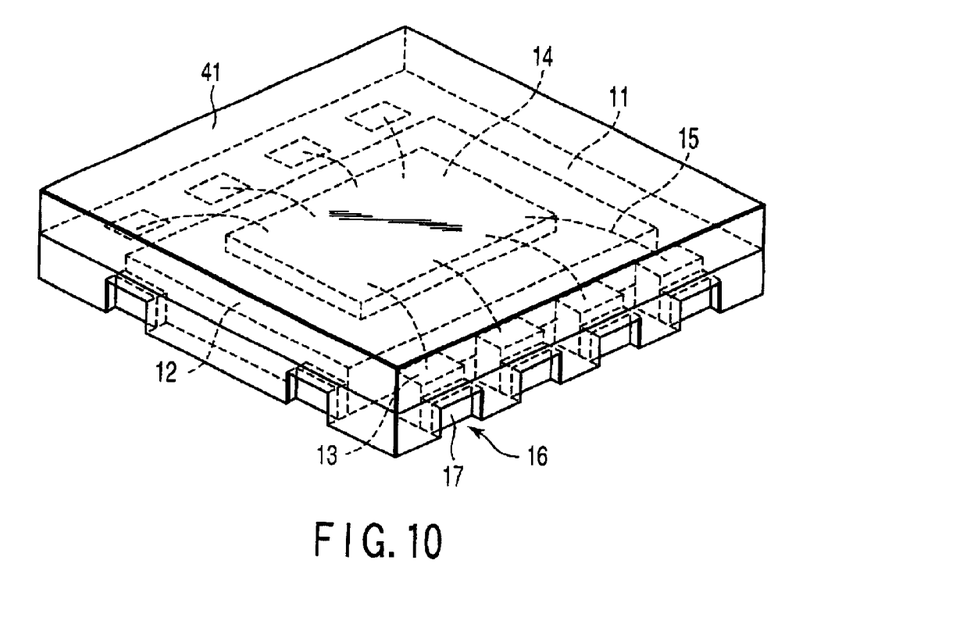
FIG. 10 is a perspective view showing a semiconductor device according to a fourth embodiment of the present invention.

FIG. 10 is perspective view of a semiconductor device according to the fourth embodiment of the present invention. The structure of the semiconductor device according to the fourth embodiment will now be described. The descriptions of the same components as those of the first embodiment are omitted from the fourth embodiment.

In the semiconductor device of the fourth embodiment, sealing resin 41 is used in which magnetic substances are scattered, as shown in FIG. 10. After the sealing resin 41 is formed by containing the magnetic substances in resin, a semiconductor chip 14 is sealed with the sealing resin 41.

The foregoing fourth embodiment can produce the same advantage as that of the first embodiment.

In the fourth embodiment, the semiconductor chip 14 is sealed with the sealing resin 41 containing magnetic substances against undesired radiation that is to become a problem when the power amplifier is mounted on a motherboard. Noise can thus be reduced.

The structure of the fourth embodiment can be applied to the multilayer substrate of the second embodiment and the structure having a passive element of the third embodiment.

The present invention is not limited to the above embodiments. Various changes and modifications can be made without departing from the scope of the subject matter of the invention when the invention is reduced to practice. For example, the present invention can be modified as follows.

Figure 11:
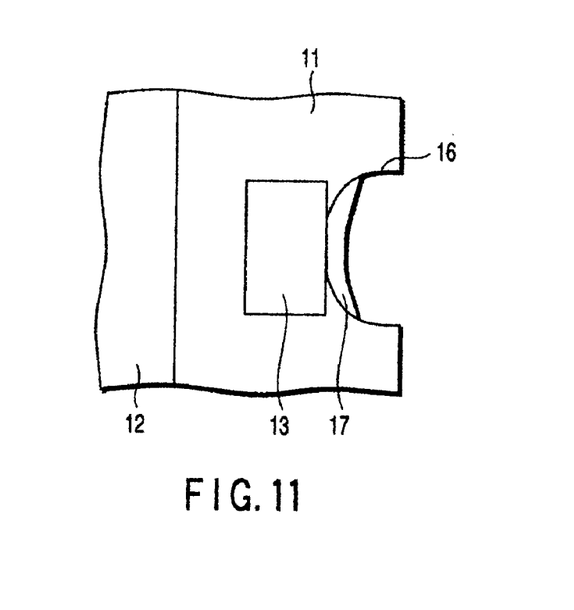
FIG. 11 is a view partly showing the back of the semiconductor device according to each of the embodiments of the present invention as a modification to a concave portion of the semiconductor device.

The concave portions 16 are not limited to a quadrilateral. For example, the corners of the concave portion 16 can be shaped like a semicircle as shown in FIG. 11.

The mounting method is not limited to a typical face-up type mounting method using wire bonding. A flip-chip type mounting method can be employed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a substrate;

a semiconductor chip arranged on the substrate;

a first electrode formed in the substrate and connected to the semiconductor chip;

a concave portion provided on a side of the substrate, the concave portion extending from a back of the substrate and not reaching a top of the substrate, and at least part of the first electrode being exposed to the concave portion; and a metal layer formed on said at least part of the first electrode.

2. The semiconductor device according to claim 1, wherein the metal layer does not reach the side of the substrate.

3. The semiconductor device according to claim 1, wherein the substrate is a multilayer substrate including at least two layers.

4. The semiconductor device according to claim 3, wherein the concave portion is provided in a layer other than an uppermost layer of the multilayer substrate.

5. The semiconductor device according to claim 3, wherein the concave portion is provided in a layer other than a multilayer including an uppermost layer of the multilayer substrate.

6. The semiconductor device according to claim 3, wherein the concave portion is provided in a lowermost layer of the multilayer substrate.

7. The semiconductor device according to claim 3, wherein the concave portion is provided in a multilayer including a lowermost layer of the multilayer substrate and excluding an uppermost layer of the multilayer substrate.

8. The semiconductor device according to claim 1, wherein the semiconductor chip comprises an active element.

9. The semiconductor device according to claim 1, wherein the semiconductor chip comprises an active element and a passive element.

10. The semiconductor device according to claim 1, further comprising sealing resin formed on the substrate, the semiconductor chip, and the first electrode.

11. The semiconductor device according to claim 10, wherein the sealing resin includes a magnetic substance.

12. The semiconductor device according to claim 1, further comprising a second electrode formed in the substrate separately from the first electrode, and the semiconductor chip being arranged on a top of the second electrode.

13. The semiconductor device according to claim 1, wherein the semiconductor chip and the first electrode are connected to each other through a bonding wire.

14. The semiconductor device according to claim 1, wherein the concave portion is one of a quadrilateral and a semicircle.

15. The semiconductor device according to claim 1, which comprises a leadless package structure.

* * * * *